United States Patent
Lee et al.

(10) Patent No.: US 9,209,179 B2
(45) Date of Patent: Dec. 8, 2015

(54) FINFET-BASED SEMICONDUCTOR DEVICE WITH DUMMY GATES

(71) Applicant: SAMSUNG ELECTRONICS CO., LTD., Gyeonggi-do (KR)

(72) Inventors: Jin-Wook Lee, Seoul (KR); Kang-Ill Seo, Chungcheongbuk-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 63 days.

(21) Appl. No.: 14/253,439

(22) Filed: Apr. 15, 2014

(65) Prior Publication Data

US 2015/0294969 A1    Oct. 15, 2015

(51) Int. Cl.
*H01L 27/088* (2006.01)
*H01L 29/78* (2006.01)
*H01L 29/06* (2006.01)
*H01L 29/66* (2006.01)

(52) U.S. Cl.
CPC ........ *H01L 27/0886* (2013.01); *H01L 29/0692* (2013.01); *H01L 29/66795* (2013.01); *H01L 29/7855* (2013.01); *H01L 29/7856* (2013.01)

(58) Field of Classification Search
CPC ............ H01L 29/66795; H01L 27/0886; H01L 29/785; H01L 27/1211; H01L 29/0692; H01L 29/7855; H01L 29/7856; H01L 29/7535
USPC ......................... 257/401, 412, 390
See application file for complete search history.

(56) References Cited

U.S. PATENT DOCUMENTS

| | | |
|---|---|---|
| 6,930,351 B2 | 8/2005 | Otoi et al. |
| 7,265,005 B2 | 9/2007 | Nowak et al. |
| 7,323,374 B2 | 1/2008 | Beintner et al. |
| 7,528,033 B2 | 5/2009 | Kim |
| 7,786,518 B2 | 8/2010 | Chakravarthi et al. |
| 8,324,668 B2 | 12/2012 | Huang et al. |
| 8,350,253 B1 | 1/2013 | Zhu et al. |
| 8,878,309 B1 * | 11/2014 | Hong et al. ............. 257/401 |
| 9,000,483 B2 * | 4/2015 | Hong et al. ............. 257/192 |
| 2003/0057496 A1 * | 3/2003 | Shiau et al. ............. 257/355 |
| 2008/0111194 A1 | 5/2008 | Kawakita |
| 2009/0315116 A1 | 12/2009 | Sakuma |
| 2013/0187237 A1 | 7/2013 | Yu et al. |
| 2015/0187571 A1 * | 7/2015 | Fan et al. ........ H01L 21/02381 |

FOREIGN PATENT DOCUMENTS

JP    2002289871    10/2002

* cited by examiner

*Primary Examiner* — Shouxiang Hu
(74) *Attorney, Agent, or Firm* — F. Chau & Associates, LLC

(57) ABSTRACT

A semiconductor device is provided. A substrate includes first and second active fins disposed in a row along a first direction. The first and second active fins are spaced apart from each other. A first dummy gate and a second dummy gate are disposed on the substrate and are extended in a second direction intersecting the first direction. The first dummy gate covers an end portion of the first active fin. The second dummy gate covers an end portion of the second active fin facing the end portion of the first active fin. A first dummy spacer is disposed on a sidewall of the first dummy gate. A second dummy spacer is disposed on a sidewall of the second dummy gate. The sidewall of the second dummy gate faces the sidewall of the first dummy gate. The first dummy spacer is in contact with the second dummy spacer.

15 Claims, 25 Drawing Sheets

FINFET-BASED SEMICONDUCTOR DEVICE WITH DUMMY GATES

TECHNICAL FIELD

The inventive concept relates to a semiconductor device and a method of fabricating the same.

DISCUSSION OF RELATED ART

MOS transistors having a three dimensional structure, such as fin field effect transistors (FinFETs), have been introduced. Compared to planar transistors, FinFETs may have reduced a short channel effects due to their three dimensional channel structure. In addition, current driving capability of FinFETs may be increased without increasing a gate length of Fin-FETs.

SUMMARY

According to an exemplary embodiment according to the present inventive concept, a semiconductor device is provided. A substrate includes a first active fin and a second active fin. The first active fin and the second active fin are disposed in a row along a first direction. The first active fin and the second active fin are extended in the first direction. The first active fin is spaced apart from the second active fin in the first direction. A first dummy gate is disposed on the substrate. The first dummy gate is extended in a second direction intersecting the first direction. The first dummy gate covers an end portion of the first active fin. A second dummy gate is disposed on the substrate. The second dummy gate is extended in the second direction. The second dummy gate covers an end portion of the second active fin. The end portion of the second active fin faces the end portion of the first active fin. A first dummy spacer is disposed on a sidewall of the first dummy gate. A second dummy spacer is disposed on a sidewall of the second dummy gate. The sidewall of the second dummy gate faces the sidewall of the first dummy gate. The first dummy spacer is in contact with the second dummy spacer.

According to an exemplary embodiment according to the present inventive concept, a semiconductor device is provided. A substrate includes a first active fin and a second active fin. The first active fin and the second active fin are disposed in a row along a first direction. The first active fin is spaced apart from the second active fin in the first direction. A first dummy gate is disposed on the substrate. The first dummy gate is extended in a second direction intersecting the first direction. The first dummy gate covers an end portion of the first active fin. A second dummy gate is disposed on the substrate. The second dummy gate is extended in the second direction. The second dummy gate covers an end portion of the second active fin. The end portion of the second active fin faces the end portion of the first active fin. The first dummy is spaced apart from the second dummy gate at a first spacing. A first normal gate is disposed on the first active fin. The first normal gate is spaced apart from the first dummy gate at a second spacing. The first normal gate is extended in the second direction. A second normal gate is disposed on the second active fin. The second normal gate is spaced apart from the second dummy gate at the second spacing. The second normal gate is extended in the second direction. The first spacing between the first dummy gate and the second dummy gate is smaller than the second spacing between the first dummy gate and the first normal gate.

According to an exemplary embodiment according to the present inventive concept, a method of fabricating a semiconductor device is provided. A first fin and a second fin are formed on a substrate. The first fin is spaced apart from the second fin a first direction. A first field insulation film is formed between the first fin and the second fin. A top surface of the first field insulation film is substantially coplanar with a top surface of the first fin. A gate layer is formed on the first fin, the second fin and the first field insulation film. A plurality of first mandrels is formed on the first fin. A plurality of second mandrels is formed on the second fin. The plurality of first mandrels is spaced apart from each other at a first spacing. The plurality of second mandrels is spaced apart from each other at the first spacing. One of the plurality of first mandrels is spaced apart from one of the plurality of second mandrels at a second spacing. The one of the plurality of first mandrels is disposed on a boundary region between the first fin and the first field insulation film. The one of the plurality of second mandrels is disposed on a boundary region between the second fin and the first field insulation film. The second spacing is smaller than the first spacing. Each of a plurality of mandrel spacers is formed on an sidewall of each first mandrel and an sidewall of each second mandrel. The plurality of first mandrels and the plurality of second mandrels are removed. The plurality of mandrel spacers remains on the gate layer. A plurality of first gate patterns is formed on the first fin by performing an etching process using the plurality of mandrel spacers as an etch mask. A plurality of second gate patterns is formed on the second fin by performing an etching process using the plurality of mandrel spacers as an etch mask. Each of the plurality of first gate patterns is extended in a second direction intersecting the first direction. Each of the plurality of second gate patterns is extended in the second direction. A plurality of spacers is formed. Each spacer is disposed on an sidewall of each first gate pattern and an sidewall of each second gate pattern. Two adjacent spacers disposed on the first field insulation film are in contact with each other. Other spacers are not contact with each other.

BRIEF DESCRIPTION OF THE DRAWINGS

These and other features of the inventive concept will become more apparent by describing in detail exemplary embodiments thereof with reference to the accompanying drawings of which:

FIGS. 7 to 21 illustrate intermediate process steps for explaining a fabricating method of a semiconductor device according to another exemplary embodiment of the inventive concept;

DETAILED DESCRIPTION OF EXEMPLARY EMBODIMENTS

Figure 1:
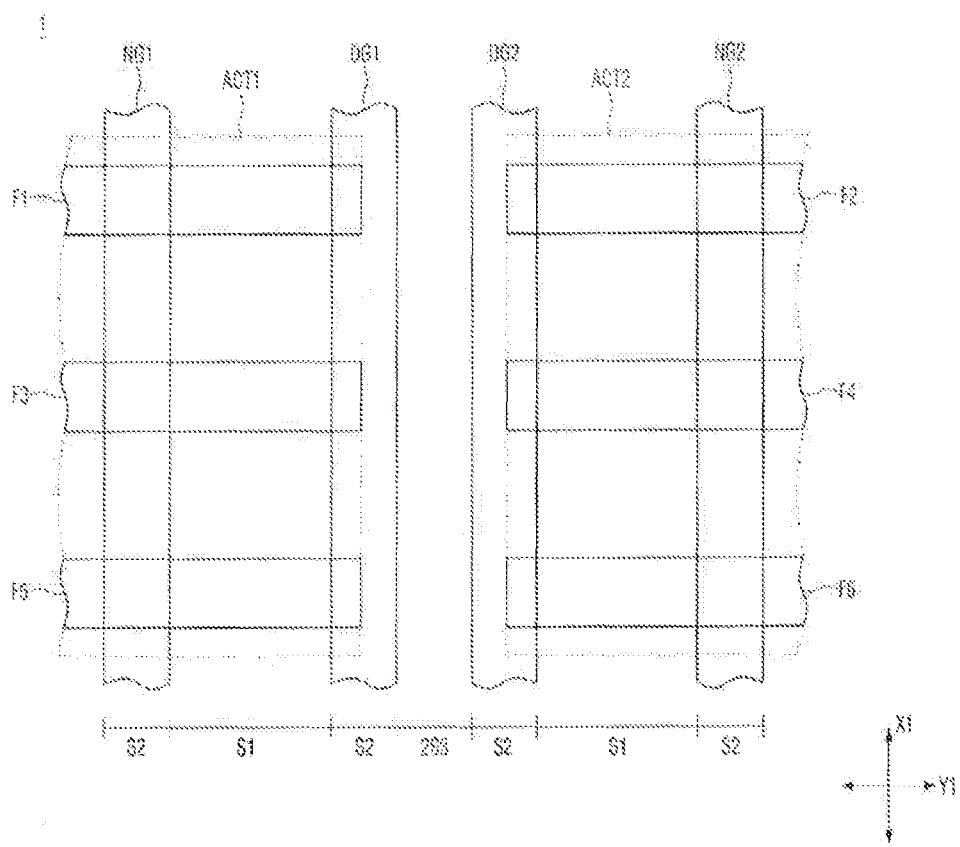
FIG. 1 is a layout view of a semiconductor device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. Like reference numerals may refer to the like elements throughout the specification and drawings.

Hereinafter, a semiconductor device according to an exemplary embodiment of the inventive concept will be described with reference to FIGS. 1 to 4B.

Figure 2:
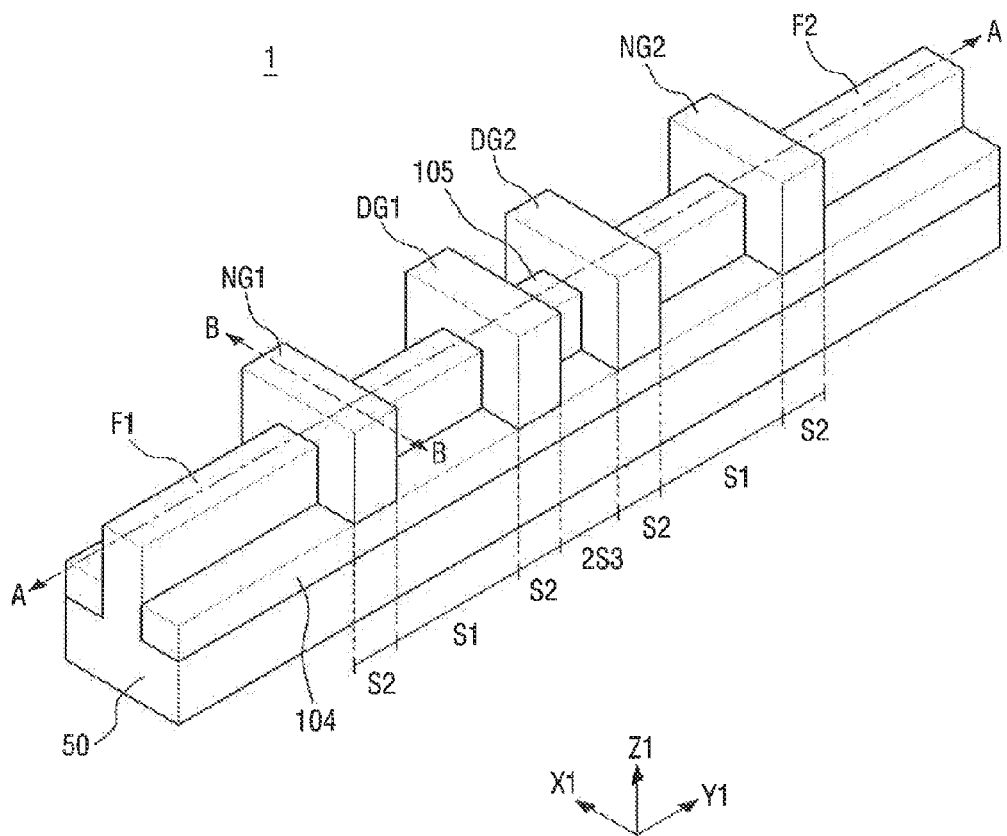
FIG. 2 is a perspective view of the semiconductor device of FIG. 1 according to an exemplary embodiment of the inventive concept.
Figure 3:
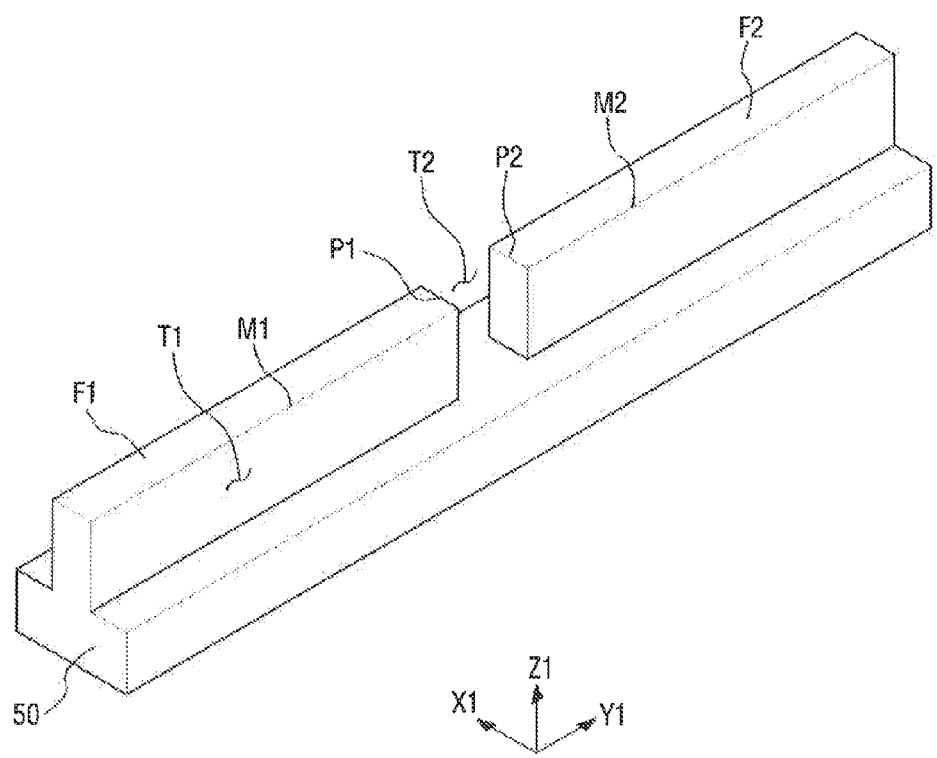
FIG. 3 is a perspective view illustrating active fins, a first trench and a second trench of the semiconductor device of FIG. 1 according to an exemplary embodiment of the inventive concept.
Figure 4A:
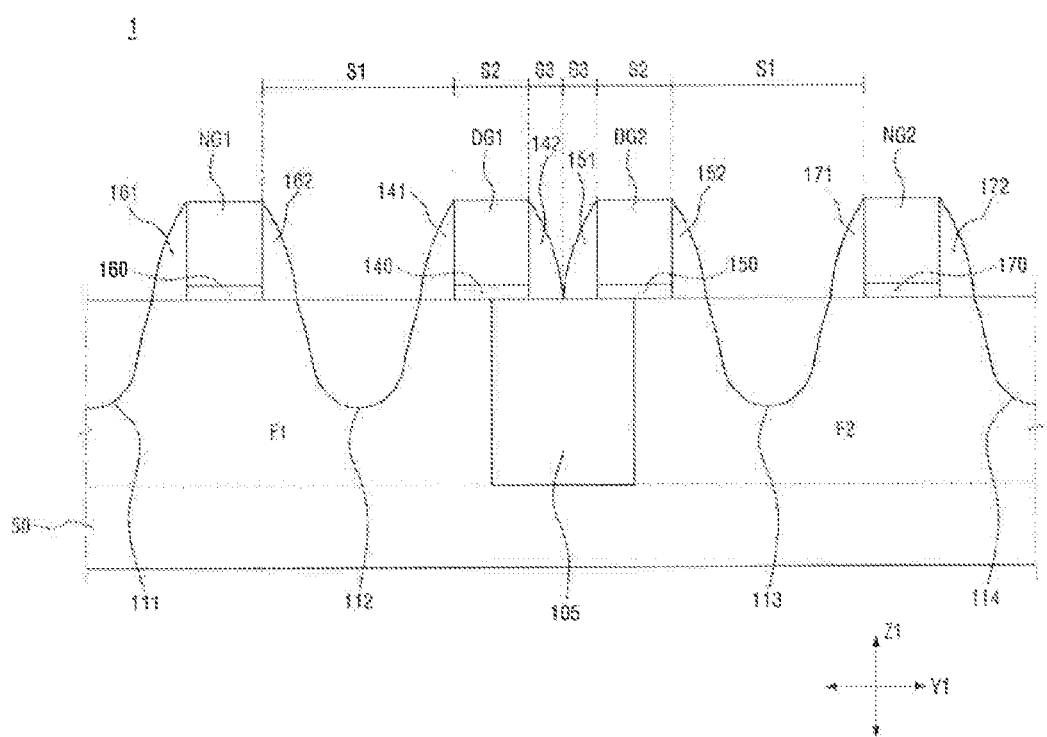
FIG. 4A is a cross-sectional view taken along line A-A of FIG. 2 according to an exemplary embodiment of the inventive concept.
Figure 4B:
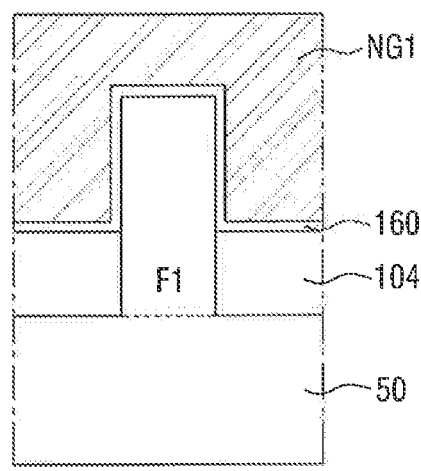
FIG. 4B is a cross-sectional view taken along line B-B of FIG. 2 according to an exemplary embodiment of the inventive concept.

FIG. 1 is a layout view of a semiconductor device according to an exemplary embodiment of the present invention, FIG. 2 is a perspective view of the semiconductor device of FIG. 1, FIG. 3 is a perspective view illustrating active fins, a first trench and a second trench of the semiconductor device of FIG. 1, and FIG. 4A is a cross-sectional view taken along line A-A of FIG. 2, and FIG. 4B is a cross-sectional view taken along line B-B of FIG. 2.

Referring to FIG. 1, the semiconductor device 1 includes a plurality of active regions ACT1 and ACT2, a plurality of active fins F1 to F6, a plurality of dummy gates DG1 and DG2 and a plurality of normal gates NG1 and NG2. The plurality of active regions ACT1 and ACT2 are arranged in a matrix configuration, but the inventive concept is not limited thereto. For example, the first active region ACT1 is adjacent to the second active region ACT2 in a second direction Y1. The plurality of active regions ACT1 and ACT2 is defined by a second field insulation film 105 of FIG. 2.

The plurality of active fins F1 to F6 is arranged in the plurality of active regions ACT1 and ACT2. For example, some active fins F1, F3 and F5 are arranged in the first active region ACT1, and the other active fins F2, F4 and F6 are arranged in the second active region ACT2.

The plurality of active fins F1 to F6 extends in the second direction Y1.

At least two fins are arranged lengthwise in a row, and the at least two fins are disposed in different active regions. For example, two fins F1 and F2 are arranged in a row, extending in the second direction Y1. The first fin F1 is disposed in the first active region ACT1. The second fin F2 is disposed in the second active region ACT2. The two fins F1 and F2 are spaced apart from each other in the second direction Y1. Similarly, two other fins F3 and F4 are arranged in a row, extending in the second direction Y1. The third fin F3 is disposed in the active region ACT1. The fourth fin F4 is disposed in the active region ACT2. In addition, some active fins within the same active region are arranged in their widthwise direction of a first direction X1. The first direction X1 intersects the second direction Y1.

Each of the plurality of dummy gates DG1 and DG2 extends lengthwise in the first direction X1 intersecting the second direction Y1. The normal gates NG1 and NG2 are separated from each other by the dummy gates DG1 and DG2. Each of the normal gates NG1 and NG2 extends lengthwise in the first direction X1. For the convenience of a description, the plurality of normal gates includes two normal gates, but the inventive concept is not limited thereto.

For example, a pitch between the first dummy gate DG1 and the second dummy gate DG2 may include a width 2S3. Here, a pitch between the first normal gate NG1 and the first dummy gate DG1 and a pitch between the second normal gate NG2 and the second dummy gate DG2 may include a width of S1, and 2S3 may be smaller than S1. In addition, a sum of a width S2 of the first dummy gate DG1 and a width S2 of the second dummy gate DG2 may be greater than a width S2 of the first normal gate NG1 or a width S2 of the second normal gate NG2.

Referring to FIGS. 2 and 3, the active fins F1 and F2 of FIG. 1 extends lengthwise in the second direction Y1. The active fins F1 and F2 may be part of the substrate 50. Alternatively, the active fins F1 and F2 may be an epitaxial layer grown from the substrate 50.

The active fins F1 and F2 are a rectangular parallelepiped, but the inventive concept is not limited thereto. For example, the active fins F1 and F2 may be chamfered. Since the active fins F1 and F2 are formed lengthwise in the second direction Y1, they include long sides M1 and M2 formed along the second direction Y1 and short sides P1 and P2 formed along the first direction X1. For example, the first active fin F1 includes a first short side P1 and a first long side M1, and the second active fin F2 includes a second short side P2 and a second long side M2. The first short side P1 of the first active F1 faces the second short side P2 of the second active F2. If the active fins F1 and F2 have round corners and/or edges, the long sides M1 and M2 and the short sides P1 and P2 are determined in a similar way. For example, the long, round sides M1 and M2 are formed along the second direction Y1. The short, round sides P1 and P2 are formed along the first direction X1.

The active fins F1 and F2 may serve as active patterns of a multi-gate transistor. For example, channels are three-dimensionally formed along two facing side surfaces and one top surface of the active fins F1 and F2. The two facing side surfaces are part of the long sides M1 and M2 of the two active fins F1 and F2, respectively.

Referring to FIG. 3, the first trench T1 is formed to expose the long sides M1 and M2 of the active fins F1 and F2. The second trench T2 is formed to expose the short sides P1 and P2 of the active fins F1 and F2. For example, the first trench T1 is formed between the first active fin F1 and the third active fin F3 of FIG. 1. The active fins F1 and F3 are disposed in the same active region ACT1. The first trench T1 is also formed between the second active fin F2 and the fourth active fin F4 of FIG. 1. The active fins F2 and F4 are disposed in the same active region ACT2. The active fins F3 and F4 of FIG. 1 may be parallel to the active fins F1 and F2 in the second direction Y1. The second trench T2 is disposed between the short side P1 of the first active fin F1 and the short side P2 of the second active fin F2. The short side P1 of the first active fin F1 and the short side P2 of the second active fin F2 face each other.

The first trench T1 and the second trench T2 have the same depth, but the inventive concept is not limited thereto. The first trench T1 and the second trench T2 are formed at substantially the same time. Alternatively, the first trench T1 and the second trench T2 are separately formed, and depths of the first trench T1 and the second trench T2 may be different from each other.

Referring to FIG. 2, field insulation films 104 and 105 are formed on the substrate 50, surrounding at least lower portions of the active fins F1 and F2.

The first field insulation film 104 is formed to extend lengthwise in the second direction Y1, and the second field insulation film 105 is formed to extend lengthwise in the first direction X1. The field insulation films 104 and 105 may include, for example, an oxide film, a nitride film, an oxynitride film, or combinations thereof.

The first field insulation film 104 fills a lower portion of the first trench T1, and the second field insulation film 105 fills a lower portion of the second trench T2. The top surface of the second field insulation film 105 is higher than the top surface of the first field insulation film 104. Alternatively, the top surface of the second field insulation film 105 is substantially coplanar with the top surface of the first field insulation film 104. The first field insulation film 104 is partially in contact with the long sides M1 and M2 of the active fins F1 and F2, and the second field insulation film 105 is partially in contact with the short sides P1 and P2 of the active fins F1 and F2. The second field insulation film 105 is formed between the first active fin F1 and the second active fin F2 while making direct contact with sidewalls of the active fins F1 and F2.

Alternatively, the second field insulation film 105 may completely fill the second trench T2. As the result, the top surface of the first field insulation film 104 may be lower than the top surface of the second field insulation film 105.

The width of the second field insulation film 105 is greater than the width of the first dummy gate DG1 or the width of the second dummy gate DG2. The widths are measured along the second direction Y1.

The plurality of dummy gates DG1 and DG2 and the plurality of normal gates NG1 and NG2 are formed on the corresponding active fins F1 and F2 to intersect the corresponding active fins F1 and F2. For example, the first dummy gate DG1 and the first normal gate NG1 are formed on the first active fin F1, and the second dummy gate DG2 and the second normal gate NG2 are formed on the second active fin F2. The first dummy gate DG1 is disposed on and the first and second field insulation films 104 and 105, covering one end of the first active fin F1. The second dummy gate DG2 is disposed on the first and second field insulation films 104 and 105, covering one end of the second active fin F2. The one end of the active fin F1 faces the one end of the active fin F2. In addition, the first normal gate NG1 is disposed on the active fin F1 and the first field insulation film 104, and the second normal gate NG2 is disposed on the active fin F2 and the first field insulation film 104. As described above, the first dummy gate DG1 is formed on the field insulation films 104 and 105 and the first active fin F1, and the second dummy gate DG2 is formed on the field insulation films 104 and 105 and the second active fin F2. As shown in FIG. 4A, a dummy spacer 142 is formed on one side of the first dummy gate DG1, and a dummy spacer 151 is formed on one side of the second dummy gate DG2. The one side of the first dummy gate DG1 faces the one side of the second dummy gate DG2. The dummy spacer 142 and the dummy spacer 151 are in contact with each other. As described above, a structure formed between adjacent active fins (e.g., F1 and F2) disposed in different active regions may be referred to as a semi-single diffusion break. For example, the semi-single diffusion break structure includes the second field insulation film 105 and two adjacent dummy gates DG1 and DG2 formed on the second field insulation film 105. The semi-single dummy break structure will be described in more detail.

Referring again to FIGS. 4A and 4B, the plurality of dummy gates DG1 and DG2 and the plurality of normal gates NG1 and NG2 are formed on the gate insulation films 140, 150, 160 and 170, respectively. In addition, the plurality of dummy gates DG1 and DG2 and the plurality of normal gates NG1 and NG2 may include polysilicon and a metal, but the inventive concept is not limited thereto.

The gate insulation film 160 is formed between the first active fin F1 and the first normal gate NG1. As shown in FIG. 4B, the gate insulation film 160 is formed on the top and side surface of the first active fin F1. In addition, the gate insulation film 160 is formed between the first normal gate NG1 and the first field insulation film 104. The other gate insulation films 140, 150 and 170 have substantially the same configuration as the gate insulation film 160. In addition, the gate insulation films 140, 150, 160 and 170 may include silicon oxide or a high-k dielectric material having a higher dielectric constant than silicon oxide.

A transistor of the semiconductor device 1 according to an exemplary embodiment of the inventive concept may include, for example, a gate-first structure. Therefore, sources/drains 111, 112, 113 and 114 may be formed on the active fins F1 and F2 after the forming of the plurality of dummy gates DG1 and DG2 and the plurality of normal gates NG1 and NG2. In addition, the forming of the sources/drains 111, 112, 113 and 114 may be formed by an epitaxial process. Impurities of the sources/drains 111, 112, 113 and 114 may be in situ doped during the epitaxial process.

When transistors formed on the active fins F1 and F2 are P-type field effect transistors (pFETs), the sources/drains 111, 112, 113 and 114 may include a compressive stress material. For example, the compressive stress material may be a material having a larger lattice constant than silicon (Si). The compressive stress material may include mobility of carriers of a channel region by applying compressive stress to the active fins F1 and F2.

When transistors formed on the active fins F1 and F2 are N-type field effect transistors (nFETs), the sources/drains 111, 112, 113 and 114 may include the same material as the substrate 50 or a tensile stress material. For example, when the substrate 50 includes Si, the sources/drains 111, 112, 113 and 114 may include Si or a material having a smaller lattice constant than Si, for example, SiC.

In addition, materials for forming the sources/drains 111, 112, 113 and 114 may vary according to whether transistors formed on the active fins F1 and F2 are pFETs or nFETs.

The dummy spacers 141, 142, 151 and 152 and the normal spacers 161, 162, 171 and 172 may include oxide, nitride or oxynitride. In addition, the dummy spacers 141, 142, 151 and 152 are formed on sidewalls of the plurality of dummy gates DG1 and DG2, and the normal spacers 161, 162, 171 and 172 are formed on sidewalls of the plurality of normal gates NG1 and NG2.

The substrate 50 may include Si, Ge, SiGe, GaP, GaAs, SiC, SiGeC, InAs or InP. Alternatively, the substrate 50 may be a silicon on insulator (SOI) substrate.

The top surface of the second field insulation film 105 is substantially coplanar with the top surfaces of the active fins F1 and F2 adjacent to the second field insulation film 105. The normal gate (e.g., NG1) formed on the active fin (e.g., F1) and the dummy gate (e.g., DG1) formed on the second field insulation film 105 and the active fin (e.g., F1) may have substantially the same height. As described above, the plurality of dummy gates DG1 and DG2 and the plurality of normal gates NG1 and NG2 may include polysilicon and a metal. If the plurality of dummy gates DG1 and DG2 and the plurality of normal gates NG1 and NG2 have different heights, they may differ in operating characteristics. Therefore, when the heights of the plurality of dummy gates DG1 and DG2 and the plurality of normal gates NG1 and NG2 are substantially the same as each other, their operating characteristics may be substantially similar to each other.

The pitch between two dummy gates of a semi-single diffusion break is shorter than the pitch between two normal gates disposed in a same active region. The semi-single diffusion break may prevent diffusion from occurring between the first active fin F1 and the second active fin F2.

Figure 5:
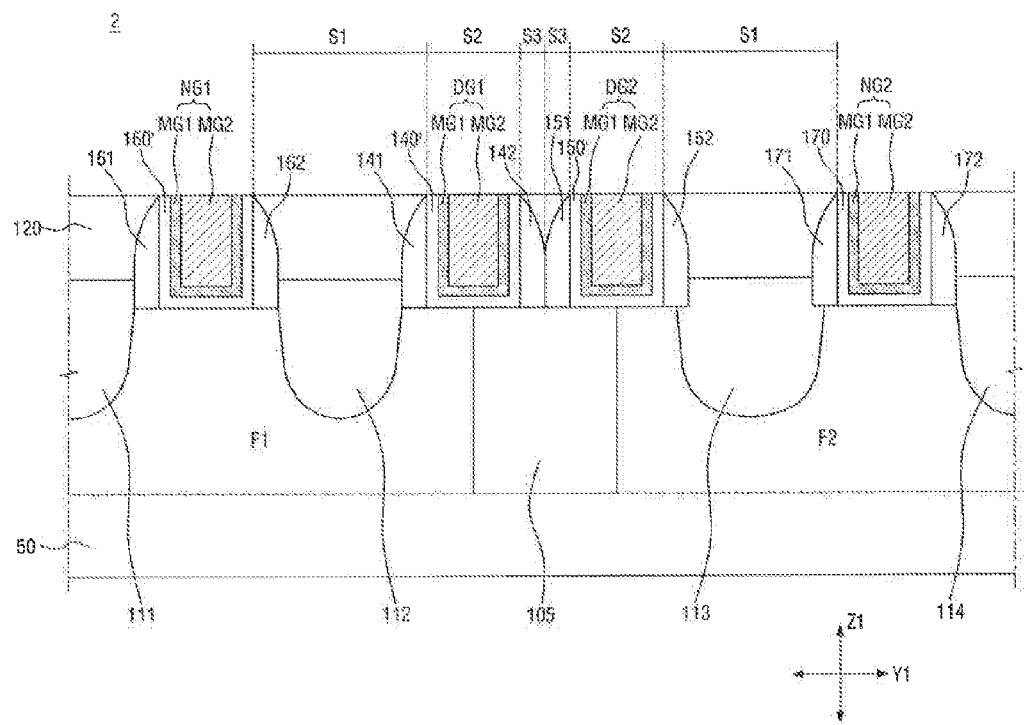
FIG. 5 is a cross-sectional view of a semiconductor device according to an exemplary embodiment of the inventive concept.

FIG. 5 is a cross-sectional view of a semiconductor device according to an exemplary embodiment of the inventive concept. For the sake of convenient explanation, the following description will focus on differences between the present exemplary embodiment and the previous exemplary embodiment of the inventive concept shown in FIGS. 1 to 4. In FIG. 5, two normal gates are exemplified, but the inventive concept are not limited thereto. For example, more than two normal gates may be provided to be spaced apart from each other.

Referring to FIG. 5, the semiconductor device 2 includes a plurality of dummy gates DG1 and DG2 and a plurality of normal gates NG1 and NG2 having two or more metal layers MG1 and MG2. For example, the plurality of dummy gates DG1 and DG2 and the plurality of normal gates NG1 and NG2 include two more metal layers MG1 and MG2 stacked one on another. The first metal layer MG1 may function to adjust a work function, and the second metal layer MG2 may function to fill a space formed by the first metal layer MG1. The first metal layer MG1 may include, for example, at least one of TiN, TaN, TiC, and TaC, and the second metal layer MG2 may include, for example, W or Al. The plurality of dummy gates DG1 and DG2 and the plurality of normal gates NG1 and NG2 may be formed by, for example, a replacement metal gate process (or a gate last process), but the inventive concept is not limited thereto.

Some sources/drains 111 and 114 are positioned between normal gates, and the other sources/drains 112 and 113 are positioned between a normal gate and a dummy gate.

The sources/drains 11, 112, 113 and 114 may be elevated sources/drains whose top surfaces are higher than the active fins F1 and F2.

In addition, among the sources/drains 111, 112, 113 and 114, some sources/drains (e.g., 113) may be formed to overlap with the dummy spacer 152 and the normal spacer 171.

The top surfaces of the sources/drains 111 and 114 formed between normal gates are substantially coplanar with the top surfaces of the sources/drains 112 and 113 formed between a normal gate and a dummy gate.

The sources/drains 111, 112, 113 and 114 may be formed by doping impurities into the active fins F1 and F2.

An insulation layer 120 is formed on the top surfaces of the sources/drains 111, 112, 113 and 114 and between the dummy spacers 141, 142, 151 and 152, and the normal spacers 161, 162, 171 and 172. The forming of the insulation layer 120 will be described in detail.

Figure 6:
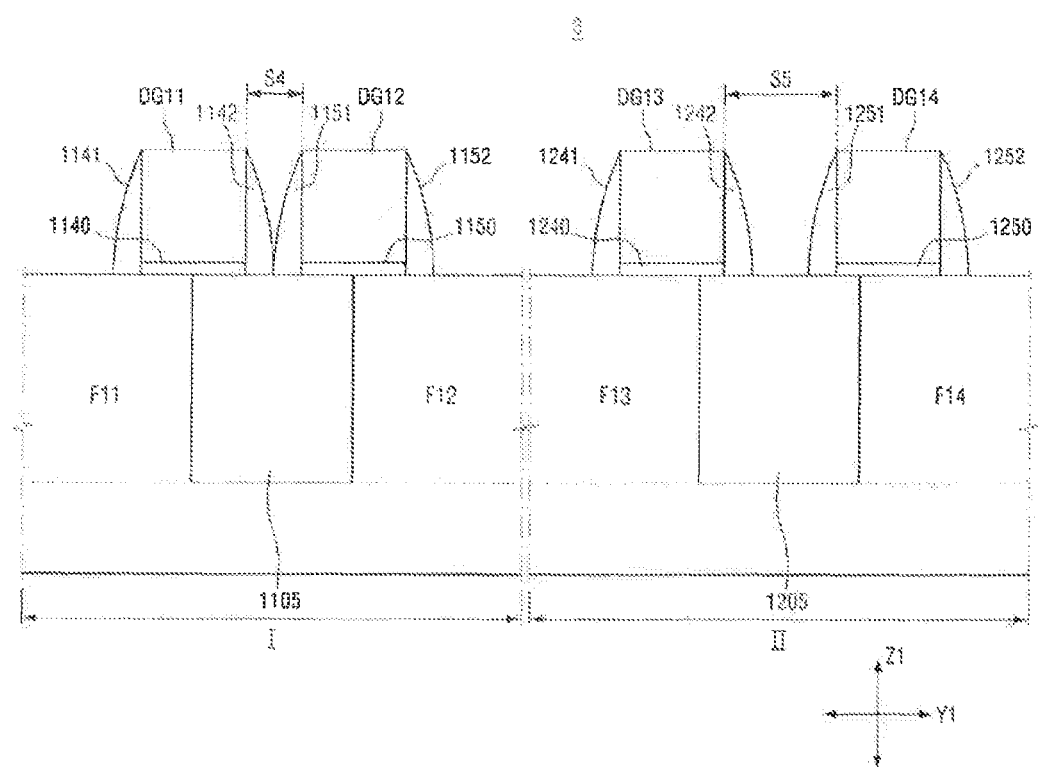
FIG. 6 is a cross-sectional view of a semiconductor device according to an exemplary embodiment of the inventive concept.

FIG. 6 is a cross-sectional view of a semiconductor device according to an exemplary embodiment of the inventive concept.

Referring to FIG. 6, the semiconductor device 3 includes a substrate 1000 having a first region I and a second region II.

The semiconductor device 3 includes a CMOS transistor. For example, the first region I of the substrate 1000 may include one of a PMOS transistor and an NMOS transistor, and the second region II of the substrate 1000 may include the other of a PMOS transistor and an NMOS transistor.

The first region I of the substrate 1000 includes two dummy gates DG11 and DG12 whose spacers 1142 and 1151 are in contact with each other, and the second region II includes two dummy gates DG13 and DG14 whose spacers 1242 and 1252 are apart from each other.

For example, the pitch S4 between dummy gates of the semiconductor device in the first region I is smaller than the pitch S5 between dummy gates of the semiconductor device in the second region I. A dummy spacer 1142 positioned at one side of a dummy gate DG11 is in contact with a dummy spacer 1151 positioned at one side of a dummy gate DG12. The dummy spacer 1142 of the dummy gate DG11 faces the dummy spacer 1151 of the dummy gate DG12. A dummy spacer 1242 positioned at one side of a dummy gate DG13 is spaced apart from a dummy spacer 1251 positioned at one side of a dummy gate DG14. The dummy spacer 1242 of the dummy gate DG13 faces the dummy spacer 1251 of the dummy gate DG14.

Since the semiconductor device of the first region I has substantially the same configuration with the semiconductor device according to the exemplary embodiment of the inventive concept (e.g., the semiconductor device shown in FIG. 4A), a detailed description thereof is omitted here.

Since the semiconductor device of the second region II has substantially the same configuration with the semiconductor device of the first region I, except for the above-described differences, a detailed description thereof is omitted here.

Hereinafter, a fabricating method of a semiconductor device according to an exemplary embodiment of the inventive concept will be described with reference to FIGS. 7 to 18.

Figure 7:
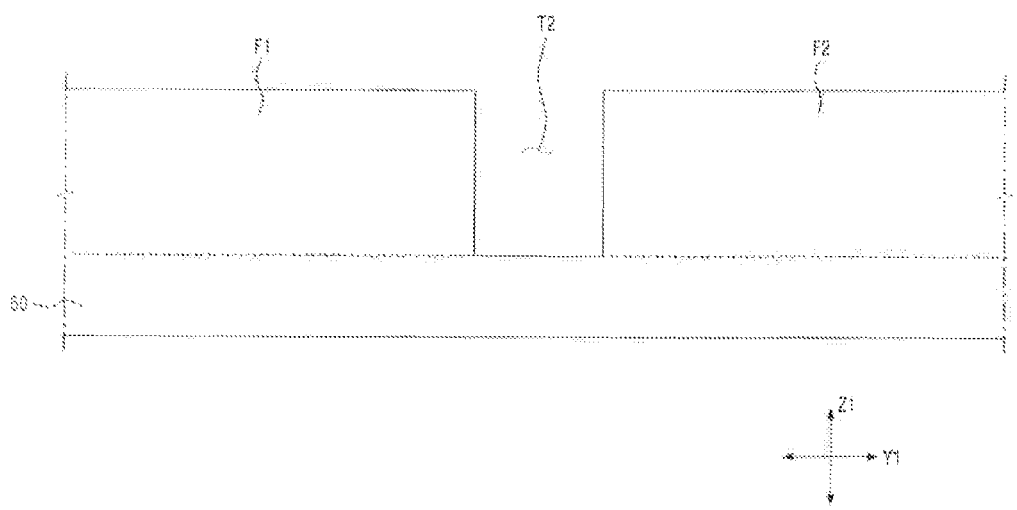
FIGS. 7 to 18 illustrate process steps for explaining a fabricating method of a semiconductor device according to an exemplary embodiment of the inventive concept.

Referring to FIG. 7, a mask is formed on the substrate 50, and the first active fin F1 and the second active fin F2 are formed using the mask to be spaced apart from each other in the second direction Y1. For example, a second trench T2 is formed between the first active fin F1 from the second active fin F2.

Figure 8:
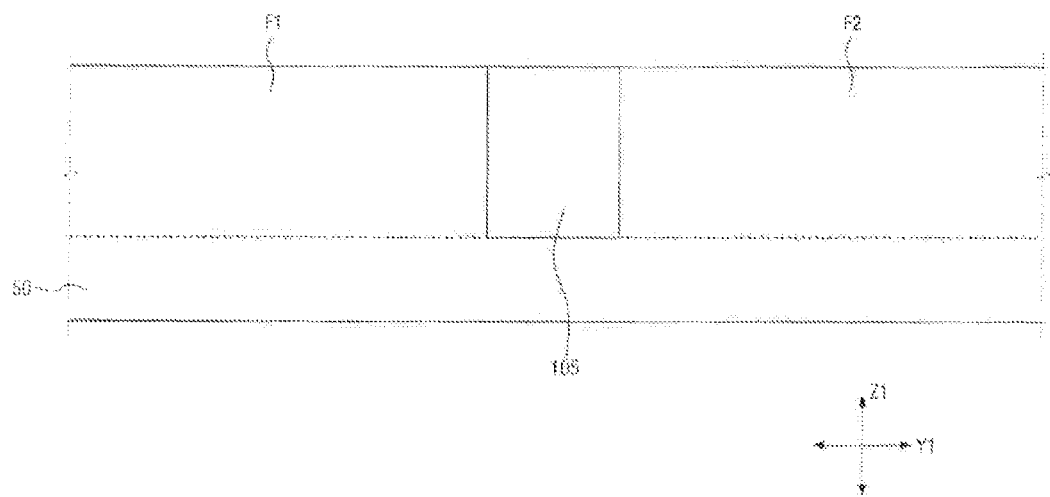

Referring to FIG. 8, a second field insulation film 105 is formed in the second trench T2. Here, the second field insulation film 105 completely fills the second trench T2. Although not shown in FIG. 8, a first field insulation film 104 is formed on at least a portion of the first trench T1, as shown in FIG. 2. The first and second field insulation films 104 and 105 surround the active fins F1 and F2.

Figure 9:
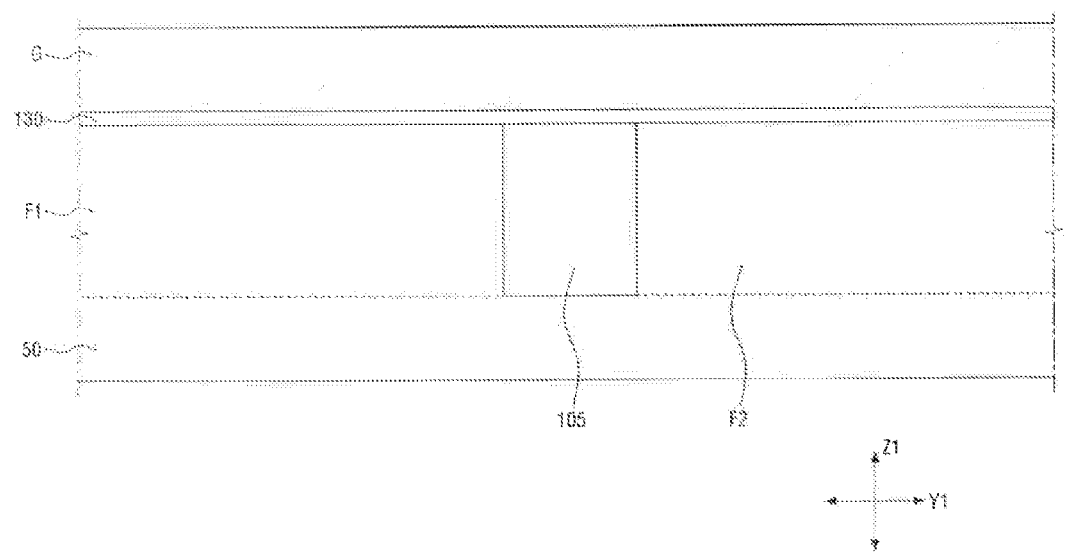

Referring to FIG. 9, a gate insulation film layer 130 and a gate layer G are sequentially formed on the first active fin F1, the second active fin F2 and the second field insulation film 105. Although not shown in FIG. 9, the gate insulation film layer 130 and the gate layer G are also sequentially formed on the first field insulation film 104, as shown in FIG. 4B.

The gate insulation film layer 130 are patterned to form the gate insulation films 140, 150, 160 and 170 shown in FIG. 4A, using an etching process to be described later. In addition, the gate layer G are patterned to form the plurality of normal gates NG1 and NG2 and the plurality of dummy gates MG1 and MG2 shown in FIG. 4A, using an etching process to be described later.

Figure 10:
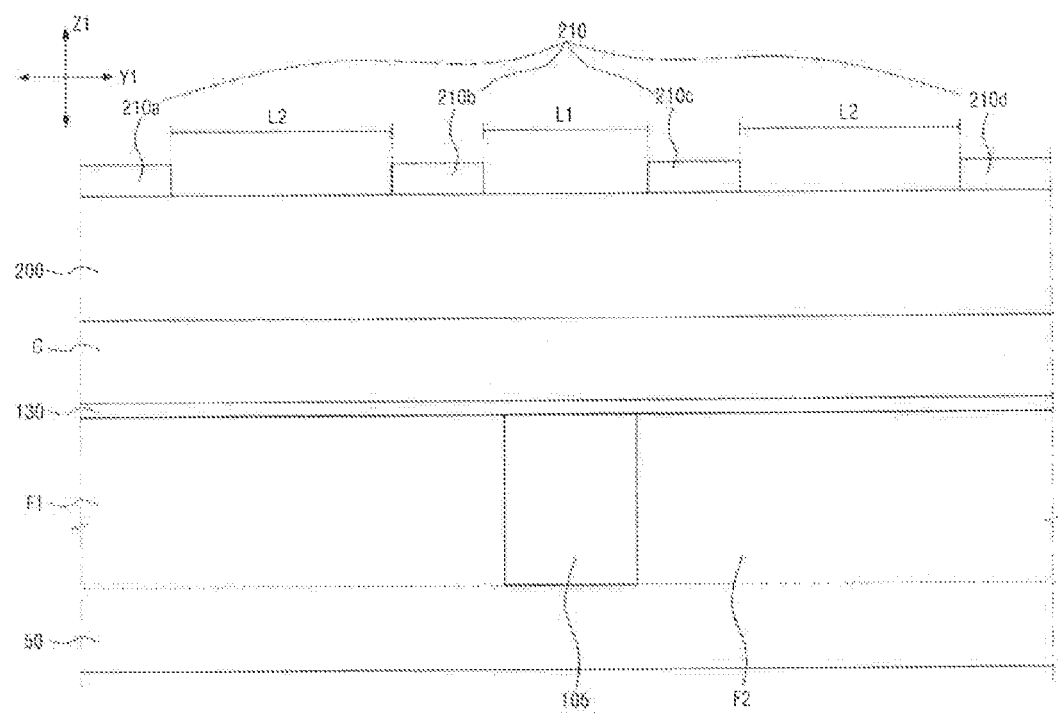
Figure 11:
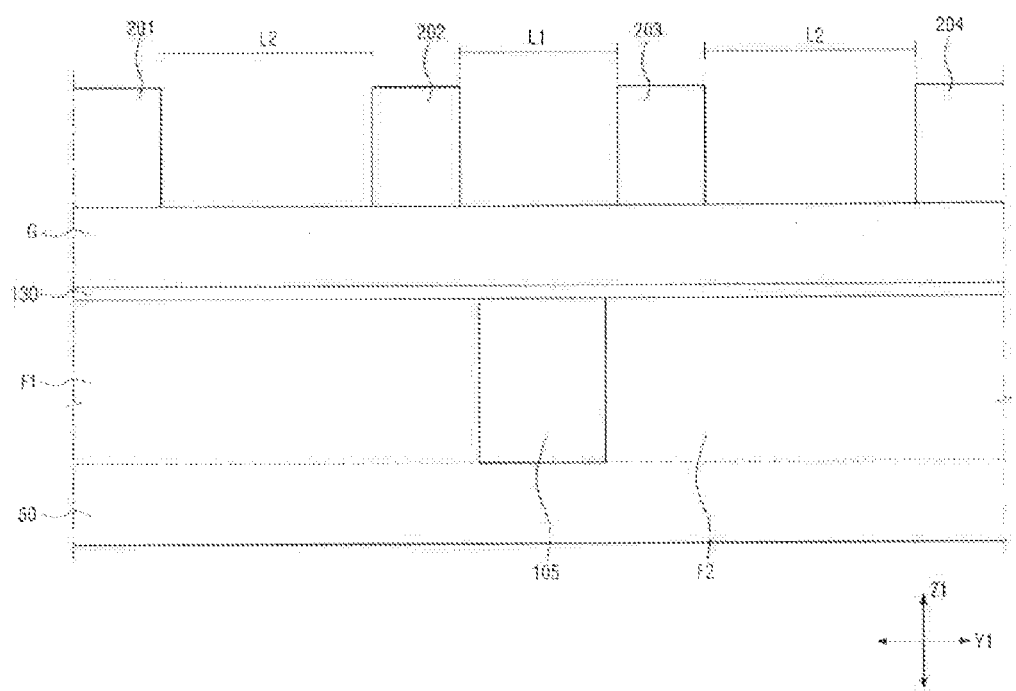
Figure 12:
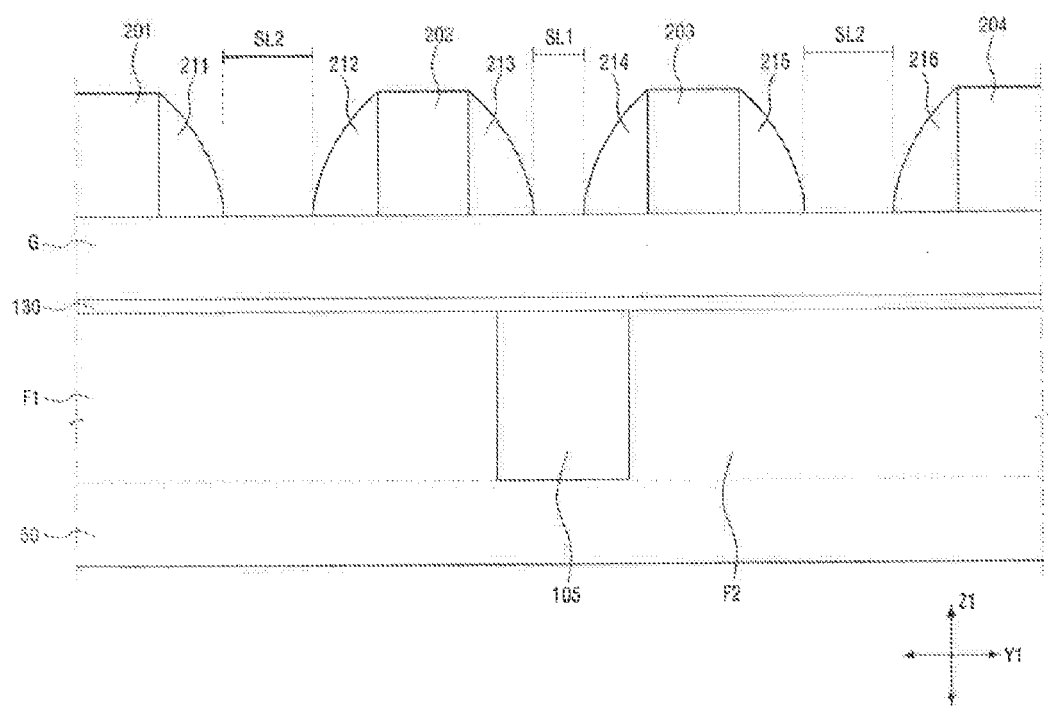
Figure 13:
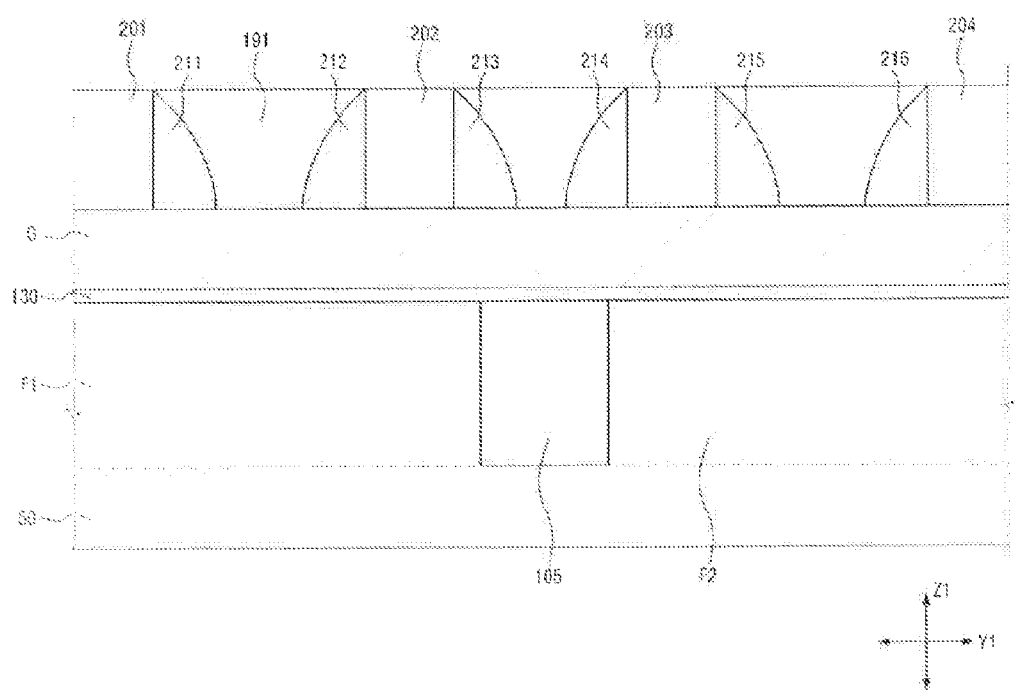

Referring to FIGS. 10 and 11, a mandrel layer 200 and a mask pattern 210 are first sequentially formed on the gate layer G.

The mandrel layer 200 may include, for example, amorphous silicon, amorphous carbon, or a combination thereof, but the inventive concept is not limited thereto.

The mask pattern 210 is formed by a lithography process, but the inventive concept is not limited thereto. In addition, in the mask pattern 210, the pitch L1 between a second mask pattern 210b and a third mask pattern 210c is smaller than the pitch L2 between a first mask pattern 210a and the second mask pattern 210b or between the third mask pattern 210c and a fourth mask pattern 210d.

The mandrel layer 200 is etched using the mask pattern 210 as a mask, thereby forming a plurality of mandrels 201, 202, 203 and 204. For example, the plurality of mandrels 201, 202, 203 and 204 are formed on the gate layer G to be spaced apart from each other in a first direction. The first mandrel 201 is spaced a predetermined distance apart from the second mandrel 202. The first mandrel 201 is disposed on the first active fin F1, and the second mandrel 202 is disposed on a region between a first dummy gate DG1 and a first normal gate NG1 that will be formed later. In addition, the third mandrel 203 is disposed on a region between a second dummy gate DG2 and a second normal gate NG2 that will be formed later, and the fourth mandrel 204 is spaced a predetermined distance apart from the third mandrel 203. The fourth mandrel 204 is disposed on the second active fin F2.

The pitch L2 between the first mandrel 201 and the second mandrel 202 is greater than the pitch L1 between the second mandrel 202 and the third mandrel 203, and the pitch L2 between the third mandrel 203 and the fourth mandrel 204 is greater than the pitch L1 between the second mandrel 202 and the third mandrel 203.

Referring to FIGS. 12 to 15, mandrel spacers 211, 212, 213, 214, 215 and 216 are formed at both sides of the plurality of mandrels 201, 202, 203 and 204, respectively. The pitch SL1 between the mandrel spacer 213 formed at one side of the second mandrel 202 and the mandrel spacer 214 formed at one side of the third mandrel 203 is smaller than the pitch SL2 between other mandrel spacers.

After the forming of the mandrel spacers 211, 212, 213, 214, 215 and 216, an insulation film 191 is formed to cover the gate layer G, the plurality of mandrels 201, 202, 203 and 204 and the mandrel spacers 211, 212, 213, 214, 215 and 216. The insulation film 191 is planarized until the top surfaces of the plurality of mandrels 201, 202, 203 and 204 are exposed. Here, the planarizing may be performed using, for example, a chemical mechanical polishing (CMP) process.

After the planarizing, the plurality of mandrels 201, 202, 203 and 204 are removed using the insulation film 191 as a mask. The removing may be performed using, for example, an etching process, and the insulation film 191 may have etching selectivity with respect to the plurality of mandrels 201, 202, 203 and 204.

After the removing of the plurality of mandrels 201, 202, 203 and 204, the insulation film 191 is removed. Thereafter, the gate layer G is etched using the mandrel spacers 211, 212, 213, 214, 215 and 216 as etch masks. The mandrel spacers 211, 212, 213, 214, 215 and 216 may have etching selectivity with respect to the gate layer G.

If the gate layer G is etched, a plurality of gates G1 to G6 are formed on the first active fin F1 and the second active fin F2.

For example, the plurality of gates G1 to G6 may have substantially the same width S2, but the inventive concept is not limited thereto. In addition, the pitch 2S3 between a third gate G3 and a fourth gate G4 is smaller than the pitch Si between other gates.

Here, the third gate G3 is positioned on a boundary between the second field insulation film 105 and the first active fin F1. The fourth gate G4 is positioned on a boundary between the second field insulation film 105 and the second active fin F2. In addition, the first and second gates G1 and G2, separated from the third gate G3, are positioned on the first active fin F1, and the fifth and sixth gates G5 and G6, separated from the fourth gate G4, are positioned on the second active fin F2.

Figure 14:
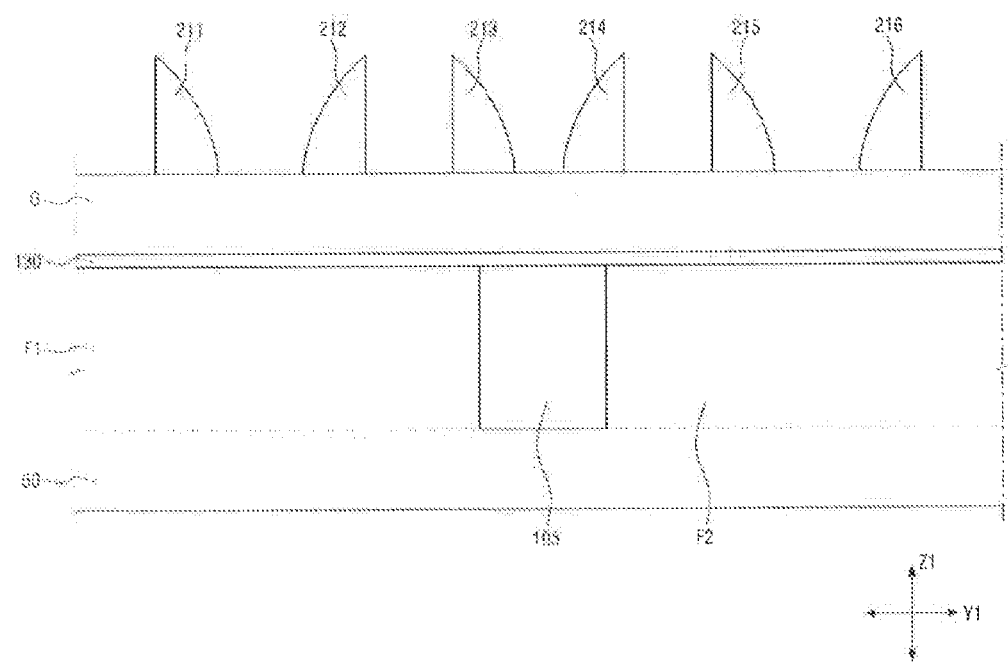
Figure 15:
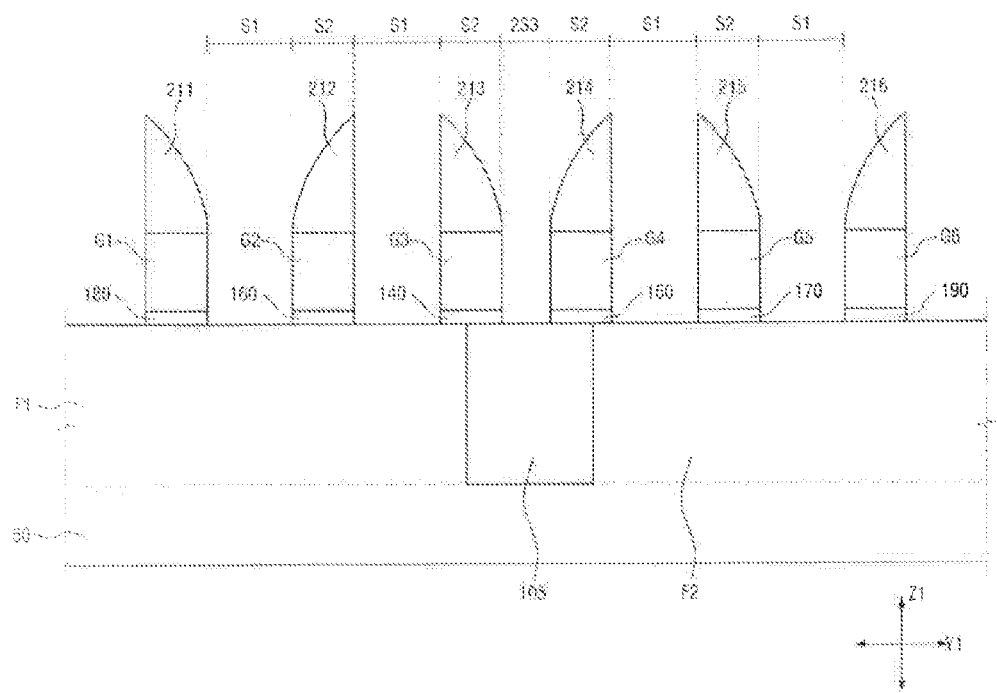
Figure 16:
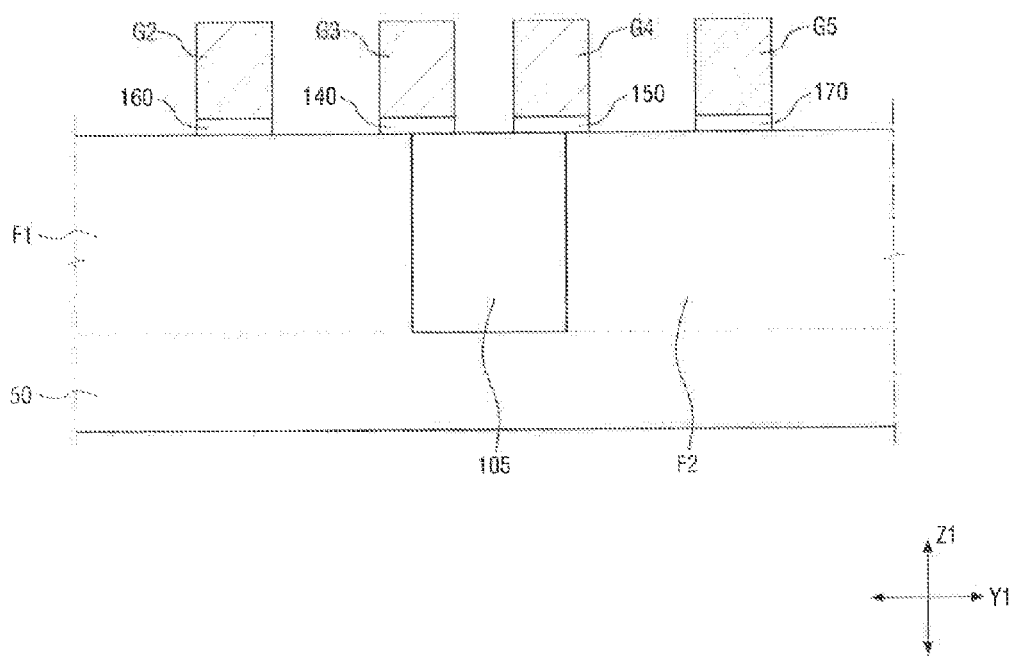
Figure 17:
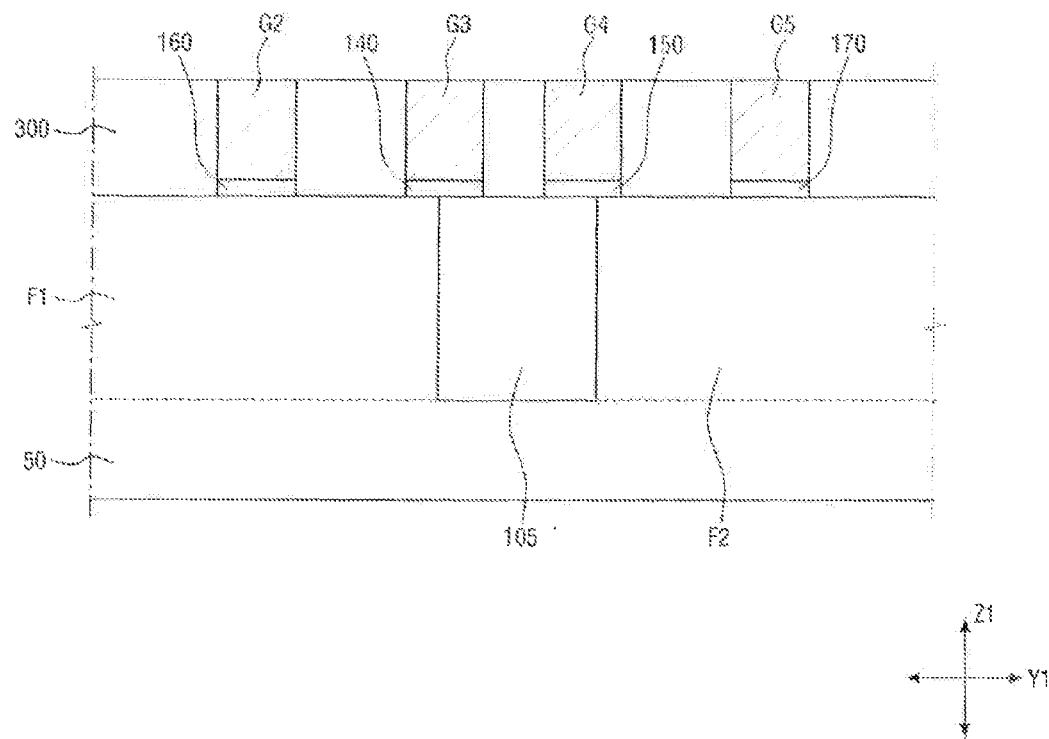
Figure 18:
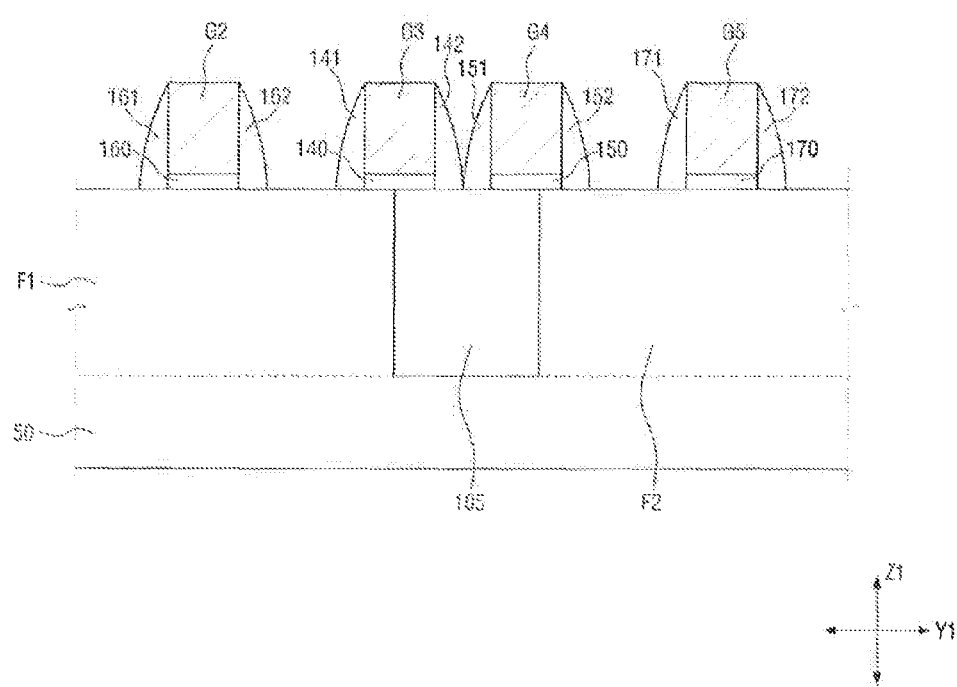

Referring to FIGS. 16 to 18, the mandrel spacers 211, 212, 213, 214, 215 and 216 shown in FIG. 14 are removed. After the removing of the mandrel spacers 211, 212, 213, 214, 215 and 216 shown in FIG. 14, an interlayer dielectric film 300 is formed to completely cover the plurality of gates G2 to G5. For the convenience of a description, the first gate G1 and the sixth gate G6 are omitted in FIGS. 16 to 18. The process that will be described below may be applied to the first gate G1 and the sixth gate G6.

The interlayer dielectric film 300 is planarized until the top surfaces of the plurality of gates G2 to G5 are exposed. Here, the planarizing may be performed using, for example, a chemical mechanical polishing (CMP) process, but the inventive concept is not limited thereto.

After the planarizing, the interlayer dielectric film 300 is etched, thereby forming dummy spacers 141, 142, 151 and 152 and normal spacers 161, 162, 171 and 172 on both side surfaces of the gates G2 to G5, respectively.

For example, the dummy spacer 142 positioned at one side of the third gate G3 is in contact with the dummy spacer 151 positioned at one side of the fourth gate G4. In addition, the dummy spacer 141 positioned at the other side of the third gate G3 is spaced apart from the normal spacer 162 positioned at one side of the second gate G2, and the dummy spacer 152 positioned at the other side of the fourth gate G4 is spaced apart from the normal spacer 171 positioned at one side of the fifth gate G5.

Referring back to FIG. 4A, after the forming of the dummy spacers 141, 142, 151 and 152 and the normal spacers 161, 162, 171 and 172, the sources/drains 111, 112, 113 and 114 are formed in the active fins F1 and F2, thereby forming the semiconductor device 1 according to an exemplary embodiment of the inventive concept. Here, the third gate G3 and the fourth gate G4 correspond to the first dummy gate DG1 and the second dummy gate DG2, respectively, and the second gate G2 and the fifth gate G5 correspond to the first normal gate NG1 and the second normal gate NG2, respectively.

The gate insulation films 140 and 150 formed on the bottom surfaces of the third and fourth gates G3 and 04 correspond to dummy gate insulation films, and the gate insulation films 160 and 170 formed on the bottom surfaces of the second and fifth gates G2 and G5 correspond to normal gate insulation films.

The dummy gates DG1 and DG2 and the normal gates NG1 and NG2 are formed at the same time using the plurality of mandrels 201, 202, 203 and 204 to increase fabricating process efficiency.

Hereinafter, a fabricating method of the semiconductor device of FIG. 5 according to an exemplary embodiment of the inventive concept will be described with reference to FIGS. 19 to 21 together with FIGS. 7 to 18. Since the process steps shown in FIGS. 7 to 18 may be applied identically, repeated descriptions will be omitted.

Figure 19:
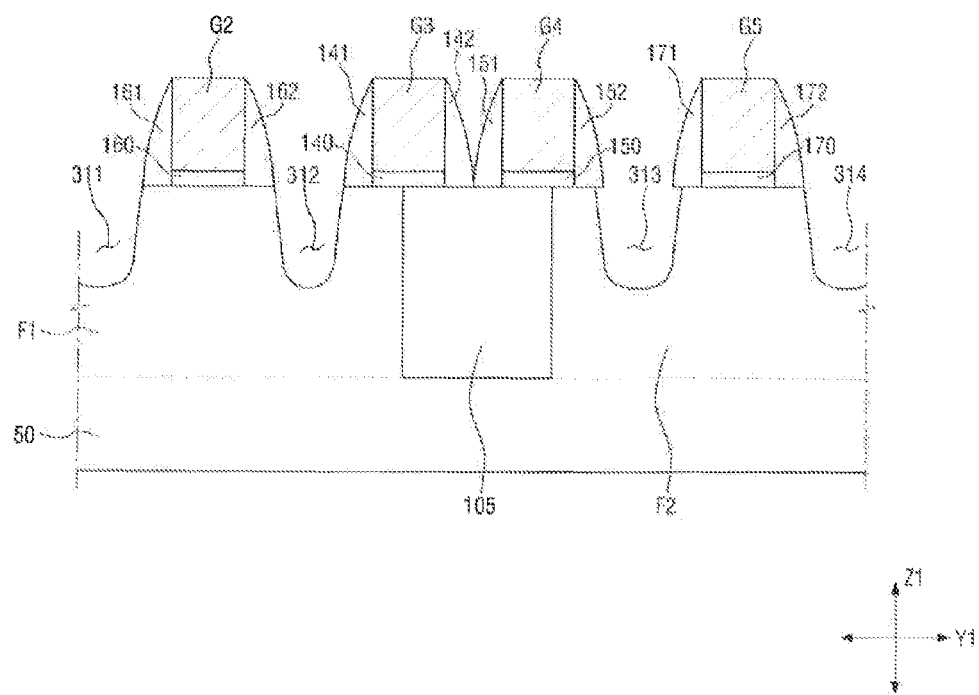

Referring to FIG. 19, recesses 311, 312, 313 and 314 are formed at both sides of the gates G2, G3, G4 and G5, respectively. However, a recess is not formed between the third gate G3 and the fourth gate G4.

The recess 313 undercuts the spacers 152 and 171.

Figure 20:
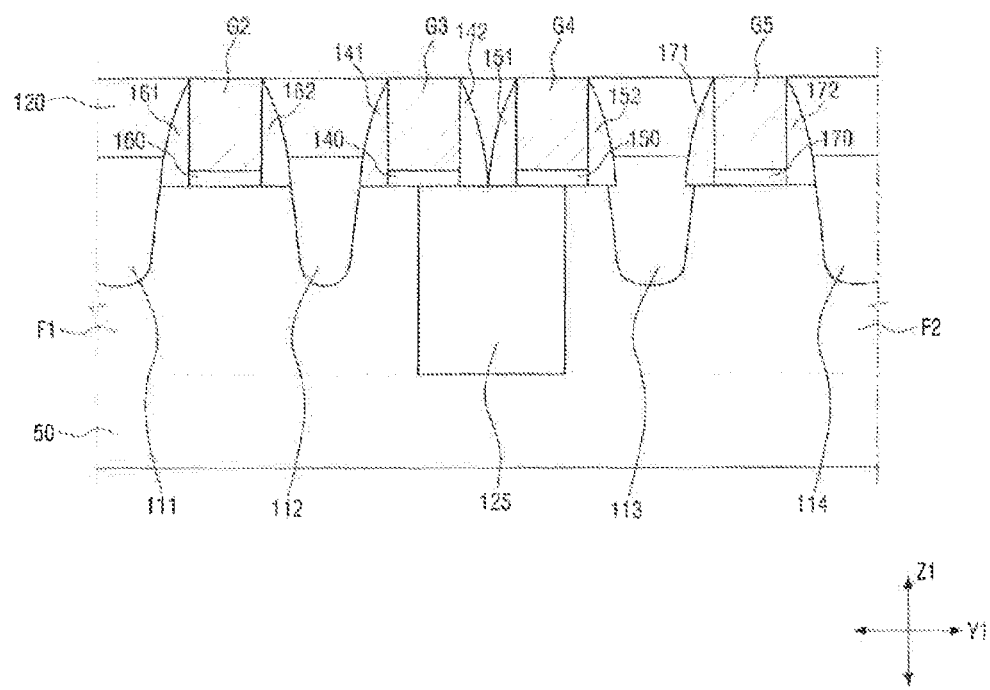

Referring to FIG. 20, sources/drains 111, 112, 113 and 114 are formed in the recesses 311, 312, 313 and 314. For example, the sources/drains 111, 112, 113 and 114 may be elevated sources/drains.

After the forming of the sources/drains 111, 112, 113 and 114, a preliminary insulation layer is formed to completely cover dummy spacers 141, 142, 151 and 152, normal spacers 161, 162, 171 and 172 and the gates G2 to G5.

After the forming of the preliminary insulation layer, the preliminary insulation layer is planarized to form an insulation layer 120 until the top surfaces of the plurality of gates G2 to G5 are exposed. Here, the planarizing may be performed using, for example, a chemical mechanical polishing (CMP) process, but the inventive concept is not limited thereto.

Figure 21:
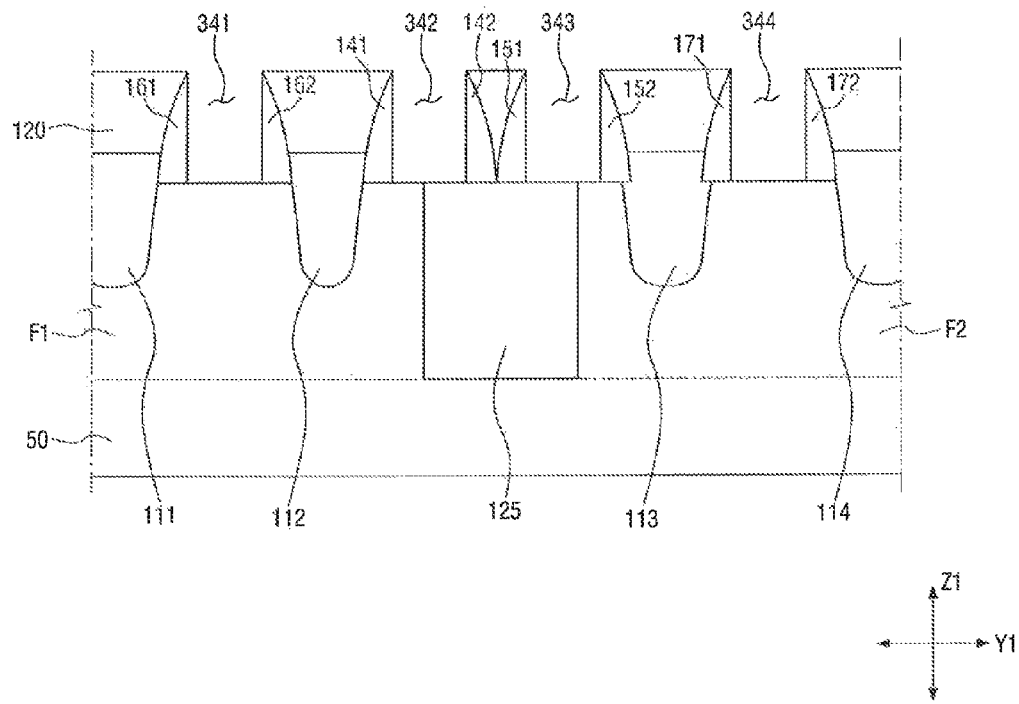

Referring to FIG. 21, the gate insulation films 140, 150, 160 and 170 and the gates G2 to G5 are removed, thereby forming a plurality of trenches 341, 342, 343 and 344.

Referring again to FIG. 5, the gate insulation films 140', 150', 160' and 170' and two or more metal layers MG1 and MG2 are stacked in the plurality of trenches 341, 342, 343 and 344, thereby forming the semiconductor device 2 according to an exemplary embodiment of the inventive concept.

In addition, the gate insulation films 140' and 150' formed on the bottom surfaces of the dummy gates DG1 and DG2 correspond to dummy gate insulation films, and the gate insulation films 160' and 170' formed on the bottom surfaces of the normal gates NG1 and NG2 correspond to normal gate insulation films.

Next, an electronic system including semiconductor devices according to some embodiments of the inventive concept will be described with reference to FIG. 22.

Figure 22:
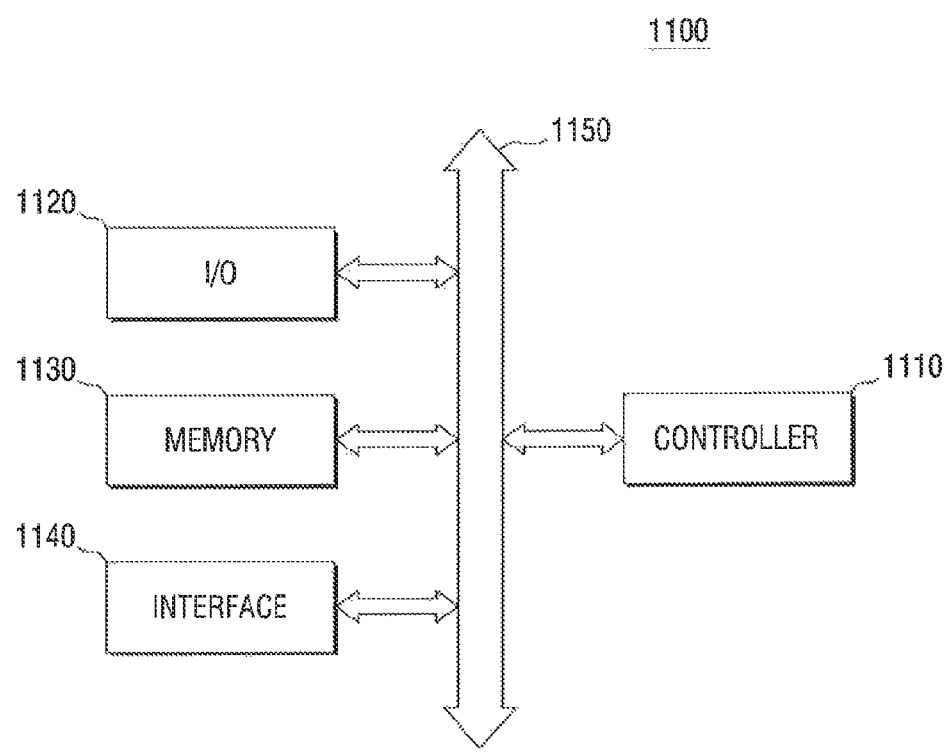
FIG. 22 is a block diagram of an electronic system including a semiconductor device according to an exemplary embodiment of the inventive concept.

FIG. 22 is a block diagram of an electronic system including a semiconductor device according to an exemplary embodiment of the inventive concept.

Referring to FIG. 22, the electronic system 1100 includes a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 corresponds to a path through which data moves.

The controller 1110 may include at least one of a microprocessor, a digital signal processor, a microcontroller, or logic elements having functions similar to those of these elements. The I/O 1120 may include a keypad, a keyboard, a display device, and so on. The memory device 1130 may store data and/or codes. The interface 1140 may transmit data to a communication network or receive data from the communication network. The interface 1140 may be wired or wireless. For example, the interface 1140 may include an antenna or a wired/wireless transceiver, and so on. Although not shown, the electronic system 1100 may further include a high-speed DRAM (Dynamic Random Access Memory) device and/or a SRAM (Static Random Access Memory) device as an operating memory for increasing the operation of the controller 1110.

A semiconductor device according to an exemplary embodiment of the inventive concept may be incorporated into the memory device 1130 or provided as part of the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 23:
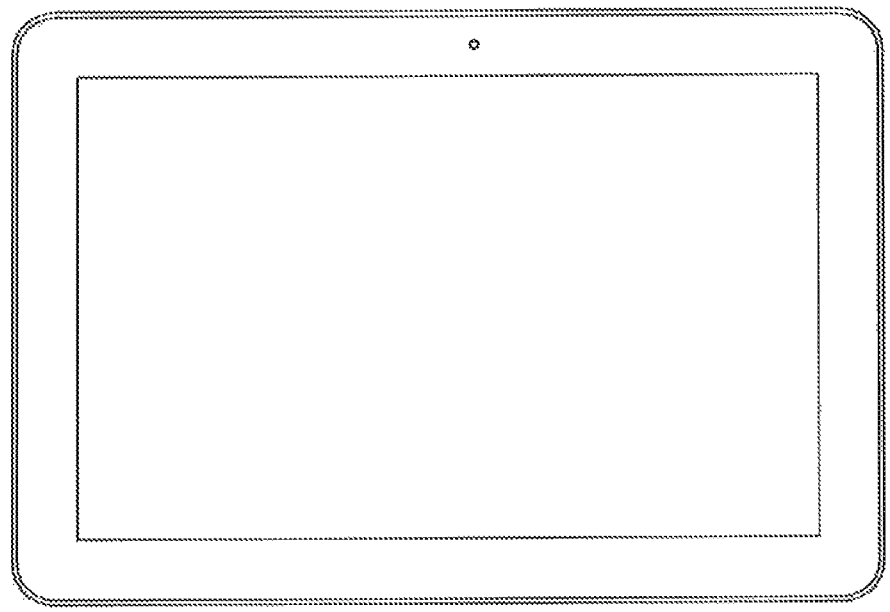
FIGS. 23 and 24 illustrate an application system employing a semiconductor device according to an exemplary embodiment of the inventive concept.
Figure 24:
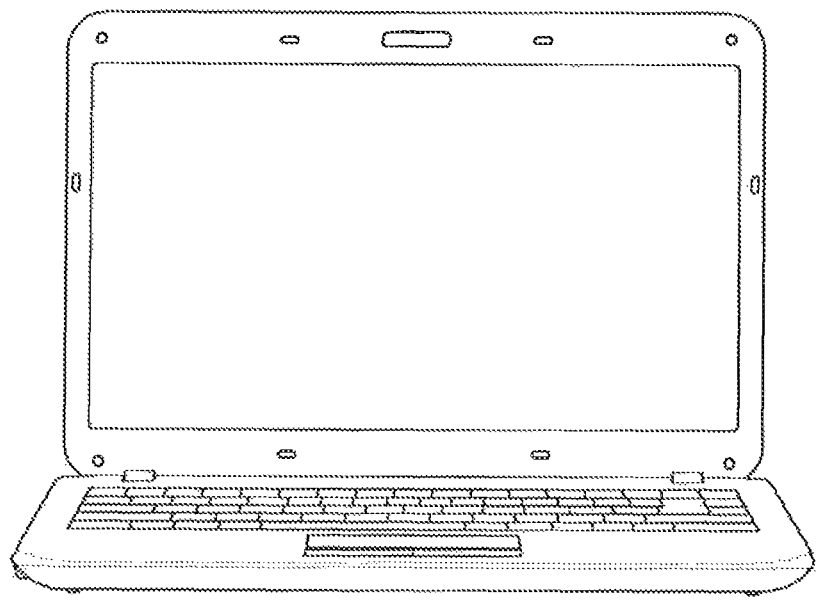

FIGS. 23 and 24 illustrate an exemplary semiconductor system employing a semiconductor device according to an exemplary embodiment of the inventive concept. FIG. 23 illustrates an exemplary embodiment of a tablet PC, and FIG. 24 illustrates an exemplary embodiment of a notebook computer. A semiconductor device according to an exemplary embodiment of the inventive concept may be employed to a tablet PC, a notebook computer, and the like.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   a substrate including a first active fin and a second active fin, wherein the first active fin and the second active fin are disposed in a row along a first direction, wherein the first active fin and the second active fin are extended in the first direction, wherein the first active fin is spaced apart from the second active fin in the first direction;
   a first dummy gate disposed on the substrate, wherein the first dummy gate is extended in a second direction intersecting the first direction, wherein the first dummy gate covers an end portion of the first active fin;
   a second dummy gate disposed on the substrate, wherein the second dummy gate is extended in the second direction, wherein the second dummy gate covers an end portion of the second active fin, wherein the end portion of the second active fin faces the end portion of the first active fin;
   a first dummy spacer disposed on a sidewall of the first dummy gate; and
   a second dummy spacer disposed on a sidewall of the second dummy gate, wherein the sidewall of the second dummy gate faces the sidewall of the first dummy gate, wherein the first dummy spacer is in contact with the second dummy spacer.

2. The semiconductor device of claim 1, further comprising:
   a first normal gate disposed on the first active fin, wherein the first normal gate is spaced apart from the first dummy gate, wherein the first normal gate is extended in the second direction; and
   a second normal gate disposed on the second active fin, wherein the second normal gate is spaced apart from the second dummy gate, wherein the second normal gate is extended in the second direction.

3. The semiconductor device of claim 2, wherein a spacing between the first dummy gate and the second dummy gate is smaller than a spacing between the first dummy gate and the first normal gate.

4. The semiconductor device of claim 2, further comprising:
   a third dummy spacer disposed on an opposite sidewall of the first dummy gate; and
   a first normal spacer disposed on a sidewall of the first normal gate, wherein the first normal spacer faces the third dummy spacer,
   wherein the third dummy spacer is spaced apart from the first normal spacer.

5. The semiconductor device of claim 2, further comprising:
   a third normal gate disposed on the first active fin, wherein the third normal gate is spaced apart from the first normal gate;
   a first source/drain disposed in the first active fin between the first normal gate and the third normal gate; and
   a second source/drain disposed in the first active fin between the first normal gate and the first dummy gate, wherein a top surface of the first source/drain is higher than a top surface of the first active fin.

6. The semiconductor device of claim 1, further comprising:
- a first trench having a first depth, wherein the first trench is disposed between the first active fin and the second active fin; and
- a first field insulation film disposed in the first trench,
- wherein a top surface of the first field insulation film is substantially coplanar with top surfaces of the first and second active fins.

7. The semiconductor device of claim 6, wherein the first dummy spacer and the second dummy spacer are disposed on the first field insulation film, wherein the first dummy spacer and the second dummy spacer cover a top surface of the first field insulation film exposed between the first dummy gate and the second dummy gate.

8. The semiconductor device of claim 6, wherein the substrate further comprising:
- a third active fin, wherein the third active fin is parallel to the first active fin and spaced apart from the first active fin in the second direction;
- a second trench having a second depth, wherein the second trench is defined between the first active fin and the third active fin; and
- a second field insulation film disposed in the second trench.

9. The semiconductor device of claim 8, wherein the second depth and the first depth are substantially the same with each other.

10. The semiconductor device of claim 8, wherein a top surface of the second field insulation film is lower than a top surface of the first field insulation film.

11. A semiconductor device comprising:
- a substrate including a first active fin and a second active fin, wherein the first active fin and the second active fin are disposed in a row along a first direction, wherein the first active fin is spaced apart from the second active fin in the first direction;
- a first dummy gate disposed on the substrate, wherein the first dummy gate is extended in a second direction intersecting the first direction, wherein the first dummy gate covers an end portion of the first active fin;
- a second dummy gate disposed on the substrate, wherein the second dummy gate is extended in the second direction, wherein the second dummy gate covers an end portion of the second active fin, wherein the end portion of the second active fin faces the end portion of the first active fin, wherein the first dummy gate is spaced apart from the second dummy gate at a first spacing;
- a first normal gate disposed on the first active fin, wherein the first normal gate is spaced apart from the first dummy gate at a second spacing, wherein the first normal gate is extended in the second direction; and
- a second normal gate disposed on the second active fin, wherein the second normal gate is spaced apart from the second dummy gate at the second spacing, wherein the second normal gate is extended in the second direction,
- wherein the first spacing between the first dummy gate and the second dummy gate is smaller than the second spacing between the first dummy gate and the first normal gate.

12. The semiconductor device of claim 11, wherein the substrate includes a first region and a second region, wherein the first and second active fins and the first and second dummy gates are formed on the first region, third and fourth active fins, a third dummy gate and a fourth dummy gate are formed on the second region, the third and fourth active fins extending in the first direction and spaced apart from each other in the first direction, the third dummy gate overlapping with one end of the third active fin and extending in the second direction on the third active fin, and the fourth dummy gate overlapping with one end of the fourth active fin, facing the one end of the third active fin, and extending in the second direction on the fourth active fin, the first dummy gate is spaced apart from the second dummy gate by a first pitch, and the third dummy gate is spaced apart from the fourth dummy gate by a second pitch different from the first pitch.

13. The semiconductor device of claim 12, wherein the first pitch is smaller than the second pitch.

14. The semiconductor device of claim 12, further comprising:
- a first dummy spacer disposed on a sidewall of the first dummy gate; and
- a second dummy spacer disposed on a sidewall of the second dummy gate, wherein the first dummy spacer is in contact with the second dummy spacer,
- wherein the sidewall of the first dummy gate faces the sidewall of the second dummy gate.

15. The semiconductor device of claim 12, further comprising:
- a third dummy spacer positioned at one side of the third dummy gate; and
- a fourth dummy spacer positioned at one side of the fourth dummy gate facing the third dummy spacer,
- wherein the third dummy spacer is spaced apart from the fourth dummy spacer.

* * * * *